(12) United States Patent
Thallner

(10) Patent No.: US 12,581,906 B2
(45) Date of Patent: Mar. 17, 2026

(54) METHOD FOR BONDING AND DEBONDING SUBSTRATES

(71) Applicant: Erich Thallner, St. Florian am Inn (AT)

(72) Inventor: Erich Thallner, St. Florian am Inn (AT)

( * ) Notice: Subject to any disclaimer, the term of this patent is extended or adjusted under 35 U.S.C. 154(b) by 636 days.

(21) Appl. No.: 17/920,854

(22) PCT Filed: May 29, 2020

(86) PCT No.: PCT/EP2020/065012
§ 371 (c)(1),
(2) Date: Oct. 24, 2022

(87) PCT Pub. No.: WO2021/239253
PCT Pub. Date: Dec. 2, 2021

(65) Prior Publication Data
US 2023/0178410 A1     Jun. 8, 2023

(51) Int. Cl.
H01L 21/683     (2006.01)

(52) U.S. Cl.
CPC .................... H01L 21/6835 (2013.01); H01L 2221/68309 (2013.01); H01L 2221/68381 (2013.01)

(58) Field of Classification Search
CPC ....... H01L 21/6835; H01L 2221/68309; H01L 2221/68381; H01L 21/67092; H01L 2221/68318
USPC .......................................... 438/109
See application file for complete search history.

(56) References Cited

U.S. PATENT DOCUMENTS

| | | | | |
|---|---|---|---|---|
| 8,587,077 B2 * | 11/2013 | Chen | .................... | B81C 1/00238 |
| | | | | 257/416 |
| 8,618,648 B1 * | 12/2013 | Kwon | ..................... | H01L 24/75 |
| | | | | 257/621 |
| 9,087,764 B2 * | 7/2015 | Chan | ........................ | H01L 24/29 |
| 9,269,561 B2 * | 2/2016 | Dang | ................ | H01L 21/02002 |
| 9,472,518 B2 * | 10/2016 | Farrens | ............ | H01L 21/28556 |
| 10,217,793 B2 * | 2/2019 | Thothadri | .............. | H05K 3/305 |
| 10,224,229 B2 * | 3/2019 | Andry | ................. | H01L 21/6835 |
| 10,297,479 B2 * | 5/2019 | Dang | .................. | H01L 21/6836 |
| 10,580,640 B2 | 3/2020 | Kamochi et al. | | |
| 11,228,158 B2 * | 1/2022 | McLaurin | ........... | H01S 5/34333 |
| 2017/0125268 A1 | 5/2017 | Dang et al. | | |
| 2017/0170048 A1 | 6/2017 | Tran-Quinn et al. | | |
| 2018/0012751 A1 | 1/2018 | Kamochi et al. | | |
| 2018/0233394 A1 | 8/2018 | Burggraf et al. | | |

FOREIGN PATENT DOCUMENTS

WO     WO-2016/152598 A1     9/2016

OTHER PUBLICATIONS

Search Report issued in Taiwanese Patent Application No. 110117426 dated Nov. 19, 2024.

(Continued)

*Primary Examiner* — Vu A Vu

(74) *Attorney, Agent, or Firm* — RENNER, OTTO, BOISSELLE & SKLAR, LLP

(57)     ABSTRACT

The invention relates to a method for the temporary bonding of a product substrate with a carrier substrate and for the debonding of a product substrate from a carrier substrate, corresponding devices and a substrate stack.

17 Claims, 1 Drawing Sheet

(56)              References Cited

OTHER PUBLICATIONS

Office Action issued in Taiwanese Patent Application No. 110117426 dated Nov. 20, 2024.

International Search Report from corresponding International Patent Application No. PCT/EP2020/065012, dated Mar. 4, 2021.

Written Opinion from corresponding International Patent Application No. PCT/EP2020/065012, dated Mar. 4, 2021.

Office Action issued in related Japanese Patent Application No. 2022-564851 dated Jun. 11, 2024.

* cited by examiner

METHOD FOR BONDING AND DEBONDING SUBSTRATES

FIELD OF THE INVENTION

The present invention relates to a method for bonding and debonding two substrates according to the coordinated claims and a corresponding substrate stack and corresponding devices.

BACKGROUND OF THE INVENTION

The advancing miniaturisation in almost all parts of microelectronics and microsystem technology provides for a constant development of all technologies, with the aid of which the density of all types of functional units on substrates can be increased. These functional units include, for example, microcontrollers, memory chips, MEMS, all types of sensors and microfluid components.

The techniques for increasing the lateral density of these functional units have been greatly improved in recent years in some sub-sectors of microelectronics or microsystem technology, even to the extent that a further increase in the lateral density of the functional units is no longer possible. In microchip production, the maximum achievable resolution limit for structures to be produced lithographically has already been as good as reached. In a few years' time, therefore, physical and technological limitations will no longer permit any further increase at all in the lateral density of functional units. The industry has already been engaged with this problem for some years by the development of 2.5D and 3D technologies. With the aid of these technologies, it is possible to align identical or even differently constituted functional elements with one another, to stack them above one another, to connect them permanently to one another and to cross-link them with one another by means of corresponding strip conductors.

One of the key technologies for the implementation of such structures is temporary bonding. Temporary bonding is understood to mean methods with the aid of which substrates can be connected to one another in such a way that their separation is possible without destroying the substrates.

In the prior art, there are a number of methods for debonding/detaching two substrates (product substrate and carrier substrate). Most methods employ so-called bonding adhesives in order to achieve a temporary, relatively easily detachable bond between two substrates. Bonding adhesives are mainly polymers, in particular thermoplastics.

It has however emerged that the use of polymers as a temporary bonding adhesive is disadvantageous, in particular due to the environmental pollution from the chemicals used for cleaning as well as the cost of the consumable materials. Furthermore, it is a drawback with all polymeric temporary bonding adhesives that the temperature resistance is far lower than the other processing temperatures of the product substrate. Temporary bonding by means of polymers thus represents a technological limitation for the processing of the product substrate.

The aim of the invention, therefore, is to at least partially eliminate, in particular completely eliminate, the drawbacks listed in the prior art. In particular, it is a an aim of the invention to specify improved methods for bonding and debonding.

SUMMARY OF THE INVENTION

The aim of the invention is solved with the features of the coordinated claims. Advantageous developments of the invention are specified in the sub-claims. All combinations of at least two features indicated in the description, in the claims and/or the drawings also fall within the scope of the invention. In stated value ranges, values lying inside the stated limits should also be deemed to be disclosed as limiting values and can be claimed in any combination.

The invention relates to a method for the temporary bonding of a product substrate with a carrier substrate, comprising at least the following steps:

producing a metallised temporary bonding layer on the product substrate and/or on the carrier substrate, bonding the product substrate with carrier substrate at the metallised temporary bonding layer.

The invention further relates to a substrate stack, in particular produced using a method according to the invention, comprising a product substrate and a carrier substrate, wherein the product substrate and the carrier substrate are connected by a metallised temporary bonding layer.

The temporary bonding layer is preferably the only layer that is used for the bonding and/or debonding method according to the invention. A further advantage thus arises over the prior art, in which a plurality of polymer layers, one for bonding and one for the debonding, are usually used above one another.

The invention further relates to a device for the temporary bonding of a product substrate with a carrier substrate, in particular using a method according to at least one of the preceding embodiments, wherein a metallised temporary bonding layer can be produced on the product substrate and/or on the carrier substrate, the product substrate can be bonded with the carrier substrate at the metallised temporary bonding layer.

In the following, the metallised temporary bonding layer is also called metallisation.

The metallised temporary bonding layer can be produced directly on the carrier substrate and/or directly on the product substrate. Alternatively, a protective layer can be arranged between the metallised temporary bonding layer and the product substrate.

The protective layer preferably has a high reflectance in order to protect the product substrate against the debonding radiation.

According to the invention, the temporary bonding layer is thus made of a metal or of a metal alloy.

In a preferred embodiment, provision is made such that a protective layer is applied on the substrate surface of the product substrate before the metallisation.

In another preferred embodiment, provision is made such that the temporary bonding layer is produced over the entire area, in particular on a protective layer on the product substrate.

In another preferred embodiment, provision is made such that the temporary bonding layer is produced in some places, furthermore preferably at elevations of the carrier substrate.

In another preferred embodiment, provision is made such that a protective layer is applied on the product substrate before the production of the metallised temporary bonding layer on the product substrate and/or on the carrier substrate.

In another preferred embodiment, provision is made such that the bonding is carried out thermally.

In another preferred embodiment, provision is made such that the carrier substrate is formed structured, wherein the carrier substrate comprises elevations and cavities, wherein the elevations are stably connected to the product substrate via metallic contacts and the cavities are arranged between the elevations.

In a further conceivable embodiment, a layer in which cavities are produced by structuring is applied on the carrier substrate.

The application of a polymer, which can easily be structured by photolithography or imprint lithography, would for example be conceivable.

The use of a sol-gel would also be conceivable, in order to produce a connection which is easy to imprint or structure, but also cures very intensely, such as $SiO_2$.

The cavities could be produced particularly easily in such a layer. In particular, such a carrier could be cleaned free from the applied layer and very easily be fed for renewed use. The metal deposited in the cavities would also be jointly removed in an extremely easy manner by such cleaning.

The cavities can be arbitrarily shaped and arbitrarily arranged. Preferably, however, the cavities have a geometrical shape that is as simple as possible and are arranged in a regular manner.

Particularly preferred shapes for the outline of the cavity wall are:

rectangular, in particular square round elliptical triangular

In particular, the triangular shape can be produced very easily by etching in (111) orientated silicon wafers.

The cavities are preferably arranged along a two-dimensional, rectangular, in particular square, grid.

In another embodiment according to the invention, the cavities can be arranged along a face-centred, two-dimensional, rectangular, in particular square grid.

The total volume of the cavities is preferably greater than 10 times, preferably greater than 100 times, still more preferably greater than 1000 times, most preferably greater than 10,000 times, with utmost preference greater than 100,000 times the volume of the temporary bonding layer. The reason for these values is that the temporary bonding layer is melted and evaporated or sublimated, and a gas volume accounts for a multiple of the solid volume.

The depth of the cavities lies between 1 nm and 100 μm, preferably between 10 nm and 50 μm, still more preferably between 50 nm and 30 μm, and most preferably between 70 nm and 20 μm, with utmost preference between 100 nm and 10 μm.

The lateral dimension of the cavities (for example the diameter of a round cavity or the side length of a rectangular cavity) lies between 10 nm and 5 mm, preferably between 50 nm and 1 mm, still more preferably between 100 nm and 500 μm, most preferably between 500 nm and 100 μm, with utmost preference between 1 μm and 50 μm.

After bonding, the jointed substrate stack comprising at least the carrier substrate, the metallised temporary bonding layer and the product substrate can be further processed.

The invention further relates to a method for debonding a product substrate from a carrier substrate, wherein the product substrate and the carrier substrate are connected by a metallised temporary bonding layer and form a substrate stack, comprising at least the following steps:

mounting and fixing the substrate stack on a substrate holder, focusing debonding radiation, in particular a laser beam, through the carrier substrate onto the metallised temporary bonding layer and thus melting, evaporating and/or sublimating the metallised temporary bonding layer, detachment of the product substrate from the carrier substrate.

The invention further relates to a device for debonding a product substrate from a carrier substrate, in particular using a method according to at least one of the preceding embodiments, wherein the product substrate and the carrier substrate are connected by means of a metallised temporary bonding layer and form a substrate stack, wherein the device at least comprises:

a substrate holder for mounting and fixing the substrate stack, a radiation source for focusing debonding radiation, in particular a laser beam, through the carrier substrate onto the metallised temporary bonding layer and thus melting, evaporating and/or sublimating the metallised temporary bonding layer, detachment means for detaching the product substrate from the carrier substrate.

The detachment means can in particular be mechanical detachment means such as for example blades.

In a further embodiment according to the invention, the detachment means can be a fluid flow which presses between the two substrates instead of the blade.

In a more preferred embodiment according to the invention, the detachment means is the substrate holder on which the product substrate and the carrier substrate are fixed. In a first embodiment according to the invention, a simple relative movement between the two substrate holders, orientated in particular normal to the substrate surfaces, takes place after the completely performed debonding according to the invention. In a second embodiment according to the invention, at least one of the two substrate holders is tilted about a rotation axis, so that the separation of the two substrates begins at the periphery. In a third embodiment according to the invention, at least one of the substrate holders is designed such that it can not only be tilted, but also bent. In this case, the substrate holder is preferably a bendable plate. One of the two substrates, preferably the carrier substrate, is then pulled off continuously starting at the periphery while it is fixed on the bendable substrate holder. The stiffness of the bendable substrate holder permits a very precise control of the lift-off process.

In a further, less preferred embodiment according to the invention, the detachment means are substrate holders which can be displaced parallel to their fixing surfaces or to the substrate surfaces. The two substrates are then separated from one another by a shearing process. This embodiment is known in the prior art as the "slide-off" technique and is used in particular in the case of substrates bonded temporarily by means of a polymeric bonding adhesive. The substrates and therefore the bonding adhesive are heated in the prior art by a heating device until such time as they can be separated from one another by the shearing process. For the method according to the invention, however, this shearing process can only function free from destruction when it can be guaranteed that as good as no further metallic contact points exist between the product substrate and the carrier substrate. If only a few metallic contact points are present between the product substrate and the carrier substrate, however, a shearing process may lead to a plastic deformation of the metallic contact points, which enables a destruction-free separation.

In particular, the aforementioned detachment means can be combined with one another.

Provision is preferably made such that the thermal conductivity of the carrier substrate lies between 0.1 W/(m*K) and 5000 W/(m*K), more preferably between 1 W/(m*K) and 2500 W/(m*K), still more preferably between 0.5 W/(m*K) and 1000 W/(m*K).

Furthermore, provision is preferably made such that the substrate stack is heated and/or cooled by heating and/or cooling.

Furthermore, provision is preferably made such that the debonding radiation is focused in a pulsed manner on the metallised temporary bonding layer.

Furthermore, provision is preferably made such that an energy input of the debonding radiation into the metallised temporary bonding layer is measured, and a radiant power of the debonding radiation is controlled.

Furthermore, provision is preferably made such that at least the carrier substrate is transparent for the debonding radiation. It is conceivable, even though improbable, for the product substrate to be transparent for the debonding radiation.

Furthermore, provision is preferably made such that the melted and evaporated and/or sublimated metallised temporary bonding layer condenses and solidifies and/or re-sublimates in cavities before the detachment of the product substrate from the carrier substrate.

In particular, the locally heated metal vapour is received in surrounding cavities of the carrier substrate. The metal vapour can either re-sublimate or first condense and then solidify in the cavities.

In other words, the temporary bonding layer is removed locally in particular by means of laser radiation.

Particularly preferred lasers and their wavelengths are

YAG (1.64 μm)

Ho:YLF (2.05 μm)

Ho:YAG (2.09 μm)

Cr:ZnS

In a further optional process step, the carrier substrate can be measured to see whether the metallisation deposited in the cavities has to be removed or not, in order for the carrier substrate to be able to be used again. Thereafter, the carrier substrate is available for the temporary bonding of further product substrates Carrier Substrate The carrier substrates can have any shape, but are preferably circular. The diameter of the substrates is in particular industrially standardised. For wafers, the standard industrial diameters are 1 inch, 2 inches, 3 inches, 4 inches, 5 inches, 6 inches, 8 inches, 12 inches and 18 inches. The carrier substrates are adapted in size and shape to the size and shape of the product substrates, in order that the employed handling technology is as straightforward as possible. Different substrate sizes mean so-called bridge tools, which are constituted in a more complex way than devices and tools for one substrate size.

In principle, however, the invention can handle any substrate, irrespective of its diameter. The carrier substrate for the temporary bonding and debonding process according to the invention can be constituted as a wafer. The carrier substrate is preferably a glass substrate.

According to the invention, it is conceivable to fix non-circular substrates, panels, to process the latter and to detach them from the carrier substrate using the described temporary bonding process.

The material of the carrier substrate can be a semiconductor material, in particular silicon. Favourable, polycrystalline silicon wafers can preferably be used as carrier substrates. In a particularly preferred embodiment according to the invention, the carrier substrate is produced from a technical glass.

The carrier substrate preferably has at least one of the following features:

Freedom from particles and/or

CMOS compatibility and/or mechanical rigidity and/or a thermal conductivity adapted to the product substrate, or higher, and/or heat resistance above the highest processing temperature, and/or thermal stability above the highest processing temperature, and/or minimal, preferably no, outgassing, including that which can be described as low vapour pressure, consequently high-vacuum suitability and/or a thermal expansion adapted to the product substrate and/or transparency for the debonding radiation.

The transparency should be described by the transmittance, which gives the ratio of the transmitted and incident radiation. The transmittance is dependent however on the thickness of the irradiated body and is not therefore a purely material-specific property. The values of the transmittance are thus given relative to a unit of length of 1 cm. In relation to the selected thickness of 1 cm and for the given selected wavelength, the material has in particular a transmittance greater than 70%, preferably greater than 80%, still more preferably greater than 90%, most preferably greater than 95%, with utmost preference greater than 99%. The transparency is particularly preferably related to the wavelength of the debonding radiation.

For the functionality of the carrier substrate, its thermal conductivity is also important, since the effect of the debonding radiation as local heating should very quickly be dissipated. The thermal conductivity of the carrier substrate preferably lies between 0.1 W(m*K) and 5000 W/(m*K), more preferably between 1 W/(m*K) and 2500 W/(m*K), still more preferably between 0.5 W/(m*K) and 1000 W/(m*K).

In a particularly preferred embodiment of the carrier substrate, it is designed structured. The carrier substrate contains elevations, which are stably connected to the product substrate via the metal contact, and depressions, which lie as channels or cavities between the elevations. The percentage bearing area, i.e. the ratio of the determined area of the elevations to the total area of the carrier substrate, can be determined as a characterising factor for the nature of the carrier substrate. The percentage bearing area of the carrier substrate preferably amounts to less than 80%, more preferably less than 75%, particularly preferably less than 50%, very particularly preferably less than 25%, in the ideal case less than 10%. However, the product substrate may be connected so firmly to the carrier substrate that the substrate stack can be further processed as a monolithic body and no undesired detachments occur.

The idea behind the arrangement of the cavities and the elevations lies in enabling efficient holding and a rapid and efficient detachment of the product substrate from the carrier substrate. For this purpose, the carrier substrate, or the elevations of the carrier substrate, is structured such that there is only a defined pattern of metallic connection points to the product substrate and not a two-dimensionally extending metallisation.

Alternatively, it is conceivable in another embodiment of the carrier substrate to produce a full-area temporary metal bond with the product substrate.

Furthermore, in an illustrative embodiment of the carrier substrate, it is preferably conceivable for the temporary metal bond to the product substrate to be produced in particular close to the carrier substrate edge at a completely closed ring and for further elevations of the carrier substrate (preferably uniformly over the area inside the metallised ring) to support the product substrate in a punctiform and/or small-area manner without metallic contact.

It is possible that not all the elevations are in metallic contact with the product substrate, but preferably only defined points distributed at the peripheral edge of the substrate stack.

According to the invention, it is therefore more advantageous if the surfaces of the metallised areas are coplanar with the surface of the non-metallised areas of the elevations. According to the invention, this can easily be brought about by the fact that the metallisation itself is produced in small depressions. It would for example be conceivable for a complete annular groove to be produced at the periphery of the carrier wafer. According to the invention, a metallisation is then produced solely in this groove, whereas the elevations inside the groove, which are intended to stabilise and support the product substrate, are free from metallisation. The different process steps for metallising solely the groove, whilst the areas close to the centre remain metallised, will not be dealt with further here. The expert in the field knows how the inner part of the carrier substrate can be masked and protected.

As a result of this structure of the carrier substrate, it is possible, during the separation, for evaporating or liquefying metal beside the elevations, in particular point-like elevations, to condense and solidify and/or re-sublimate in the cold cavities. Material is thus removed from the temporary bonding layer in a targeted and local manner. In the final phase transition of the temporary bonding layer into the solid phase, the metal will not therefore solder and/or bond again. The effect is that the substrate stack can accordingly easily be separated after the targeted breaking-open of all the bonding points.

In a particularly preferred embodiment of the carrier substrate, the elevations have a flatness, expressed as total thickness variation (TTV), less than 100 µm, preferably less than 10 µm, more preferably in less than 1 µm, most preferably less than 100 nm, with greatest preference less than 10 nm, with utmost preference less than 1 nm. The product substrate can thus be firmly held particular flat.

In another particularly preferred embodiment of the carrier substrate, the elevations are formed as domed individual areas, so that a preferably punctiform contact arises between the carrier substrate and the product substrate and the metallisation, in a form of self-alignment, preferably reduces the area of the temporarily bonded metallic contact with the capillary effect.

Furthermore, it is conceivable that the carrier substrate is treated in a partially metal-repelling manner before the metallisation, so that only the desired elevations are wetted in particular by an immersion metallisation.

Advantageously, it is conceivable for the individual areas of the elevations of the carrier substrate to be adapted to the diameter of the debanding beam. As a specific numerical example, in particular in the case of a laser spot size of 30 micrometres diameter, the elevation can be constituted as an area with a diameter of 30 micrometres, preferably 28 micrometres, particularly preferably 25 micrometres.

In general terms, it means that the elevations amount to less than 95% of the debonding spot size, preferably less than 90% of the debonding spot size, particularly preferably less than 85% of the debonding spot size, in order to achieve a rapid, efficient and high-energy energy coupling during the separation of the substrate stack.

Method for Temporary Bonding

It is preferably conceivable for a protective layer to be applied on the product substrate before the temporary bonding on the substrate surface to be bonded. The creation of the protective layer of the product substrate can be carried out separately, in terms of place and/or time, from the further process steps of the temporary bonding.

In a preferred embodiment, the protective layer, as a diffusion barrier of the metallisation, can protect the product substrate against the temporary bonding layer.

In a further preferred embodiment, the protective layer can protect a structured substrate surface of the product substrate, in particular by removable filling and covering of the cavities.

In a further preferred embodiment of the protective layer, it can serve as a bonding agent between the product substrate and the metallisation.

A metallisation is applied on the prepared substrate surface to be bonded. In an alternative embodiment of the method, the metallisation is applied on the protective layer.

In an alternative embodiment of the method according to the invention, the metallisation can be applied on the carrier substrate.

Use can advantageously be made of low-melting metals or alloys, in particular eutectic alloys. Particularly advantageously, the applied metallisation of the product substrate does not penetrate into the structure of the product substrate, so that the method does not cause any doping and any contamination.

In a further preferred embodiment, the metallisation can include a metal or an alloy of a permanent bonding layer used in the further processing, so that a diffusion of the metallisation does not have a damaging effect on the product substrate.

In particular, CMOS-compatible metals and/or alloys can be used.

In particular, the following compounds or elements can be contained in the metallisation:

metals, in particular Cu, Ag, Au, Al, Fe, Ni, Co, Pt, W, Cr, Pb, Ti, Ta, Zn, Sn.

compounds, in particular nitride compounds, in particular AlN, GaN, TiN, TaN.

Metals and/or alloys are preferably selected for the temporary bonding layer of metal that have a stability sufficient for the processing with at the same time a sufficiently low melting temperature.

As an alloy, it is particularly advantageous to use a eutectic alloy as a metallisation.

When use is made of an alloy with a eutectic concentration, the latter can be generated during the production of the metallisation or adjusted during the bonding. A eutectic alloy is characterised by the lowest of all melting points of all possible alloys that can be produced by variation of the alloy components. As a result of exceeding the eutectic temperature, the temperature at which the liquid phase is in equilibrium with the solid phase of the eutectic, the eutectic completely melts. The produced liquid phase of the eutectic concentration wets the surface of the not yet liquefied areas of the two substrates to be bonded with one another. During the solidification process, the liquid phase solidifies into the eutectic and forms the connecting layer as a temporary bonding layer between the two substrates.

According to the invention, it is in particular conceivable for the production of the metallisation to apply one alloy component on the product substrate and one alloy component on the carrier substrate.

According to the invention, it is in particular conceivable for the metallisation to be applied on the product substrate as a layer sequence of different metals and/or alloys as alloy components and/or as the complete metallisation.

According to the invention, it is in particular possible in an alternative embodiment of the method for the metallisation to be applied on the carrier substrate as a layer sequence of the alloy components and/or the complete metallisation.

It should in particular be noted that the produced layers, i.e. a protective layer and at least one metallisation should not exhibit any ageing and/or corrosion phenomena at room temperature and in normal atmosphere, in order to be able to carry out the third process step in the optimum manner. Alternatively, the metallised substrate can be stored protected in an inert atmosphere and/or in a vacuum.

Electrochemical deposition processes such as galvanisation, vapour deposition, sputtering, chemical vapour deposition (CVD) are particularly well suited as application technologies for the metallisation.

In a further process step, the product substrate is bonded together with the carrier substrate in particular thermally in a temporary bonding process for metallic temporary bonds. According to the invention, it is in particular conceivable to carry out the temporary bonding in an evacuated bonding chamber.

In a preferred embodiment, the temperature of the temporary bonding process can lie well below the further processing temperature of the product substrate, in order in particular to slow down or preferably to prevent undesired diffusion processes.

According to the invention, it is particularly advantageous that the use of metal-metal bonds reduces the particle contamination of the substrate especially with particles from organic residues.

According to the invention, it is particularly advantageous that the melting metallic temporary bonding layer takes up particles in itself as inclusions, so that a better bond quality can be achieved.

In particular, it is conceivable according to the invention for the metal-metal temporary bonds to be carried out as transient liquid phase (TLP) bonds.

Advantageously, it is in particular conceivable according to the invention for the metallisation for temporary bonding to be applied on the carrier substrate and for the temporary bond to arise between the metallised substrate surface of the carrier substrate and the protective layer of the product substrate.

In particular, it is also conceivable according to the invention for the metallisation for the temporary bonding to be applied on the carrier substrate and for the temporary bond to arise between the metallised substrate surface of the carrier substrate and the substrate surface of the product substrate to be bonded.

In particular, it is conceivable according to the invention for the employed metal bonds to be connected to one another in a fusion bonding process similar to a hybrid bonding process with subsequent heat treatment for producing the temporary bond. Fusion bonds arise primarily at the surfaces of nonmetallic-nonorganic materials. The surface portions of the product and the carrier substrate in particular in a close joint with one another can produce hydrogen bridge connections, so that the substrates in particular are protected and can be transported for the further processing such as a heat treatment. The fusion bond itself serves solely for the pre-fixing and ensures that the metallic areas which are to be connected to one another are held in position. This pre-fixing is referred to in the prior art as a pre-bond.

Pre-bonding processes describe processes in which two substrates are bonded together by van-der-Waals forces alone. This bonding process takes place primarily between silicon substrates and/or silicon oxide substrates. The bond thus produced is referred to as a pre-bond, since it is a preliminary step in a further connection. In the semiconductor industry, it is very often desired to again release a (temporary) connection produced by a pre-bond, when it is found after the pre-bonding that the two substrates are not aligned optimally or even incorrectly with one another. The two substrates connected to one another by a pre-bond can again be separated from one another usually without damage.

In other words, a fusion bond is produced as a pre-bond on the nonmetallic surface portions between the product substrate and the carrier substrate for the preliminary fixing of the substrate stack.

Two-dimensionally extending metallised surface parts of the carrier substrate can then be temporarily metallically bonded with the product substrate in a heat treatment with one another.

A method according to the invention for the fusion bonding of a product substrate with a carrier substrate includes the following process steps in an illustrative embodiment:

In a first process step of the illustrative method, the surfaces of the product substrate and/or of the carrier substrate to be jointed are prepared and structured.

In a second process step, the surfaces of the product substrate and the carrier substrate to be jointed are activated in particular in a plasma chamber by means of plasma treatment.

In a third process step, the surfaces to be jointed are rinsed especially with DI-water. Generated particles are thus also removed.

In a fourth process step, the product substrate and the carrier substrate are aligned with one another at least purely mechanically.

In a fifth process step, the product substrate and the carrier substrate are brought into contact with one another at least at a point and a bonding wave is thus started. The passage of the bonding wave bonds the substrate stack together in a pre-bond.

In a sixth process step, the substrate stack comprising a product substrate and a carrier substrate undergoes a heat treatment to produce a temporary metal-metal bond. The bonding forces (van-der-Waals forces) of the pre-bond are less than the retention force of the metallic temporary bonding layer.

Unlike the usual technology of a hybrid bond, the permanent two-dimensionally extending jointing of the nonmetallic substrate surface portions will not take place in this temporary bonding process.

The basic idea of the temporary bonding method set out here is that a substrate stack is produced, which consists at least of the carrier substrate, a metallic temporary bonding layer and a product substrate.

In other words, a substrate stack is produced with the disclosed temporary bonding method, wherein the temporary bonding layer is a metal or a metal alloy layer and wherein the temporary bonding layer in the temporary bonding method according to the invention can be removed in particular free from residue and free from particles from the product substrate. A further advantage is that the substrates of the substrate stack can absorb greater processing forces than with a polymeric intermediate layer. By means of the subsequently described separating process, the substrate stack can be separated with little force and/or with little distortion and/or little stress. Furthermore, it is advantageous that no solvents and/or chemicals, in other words no wet chemistry, have to be used for the separation.

The product substrate thus protected and supported as part of a substrate stack can thus be further processed in a manner that is simpler, more material-friendly and more cost-effective than a substrate stack fixed with adhesive polymer.

Method for Debonding

The method for separating the carrier substrate from the product substrate has the following steps in an illustrative embodiment, in particular the following sequence:

In a first process step, the temporarily bonded substrate stack is mounted and fixed on a substrate holder.

The substrate holders comprise fixing means. The fixing means serve to fix the substrates. The fixing means can be the following:

1. mechanical fixing means, in particular
1.1 clamps,
2. vacuum fixing means, in particular with
2.1. individually controllable vacuum tracks,
2.2 vacuum tracks connected to one another,
3. electrical fixing means, in particular
3.1. electrostatic fixing means,
4. magnetic fixing means,
5. adhesive fixing means, in particular Gel-Pak fixing means, and/or
6. fixing means with adhesive, in particular controllable, surfaces.

The fixing means are in particular electronically controllable.

The vacuum fixing means is the preferred kind of fixing. The vacuum fixing means preferably comprises a plurality of vacuum tracks, which emerge at the surface of the substrate holder. The vacuum tracks are preferably individually controllable. In a technically preferred application, several vacuum tracks are united to form vacuum track segments which are individually controllable, i.e. can be evacuated or flooded separately. Each vacuum segment is however independent of the other vacuum segments. The possibility of constituting individually controllable vacuum segments is thus obtained. The vacuum segments are preferably annular. A targeted, radially symmetrical fixing and/or release of a substrate, in particular a product substrate, from the sample holder, in particular performed from the inside outwards, is thus enabled.

In a second process step, at least one bundled energy beam having at least one wavelength, in particular a laser beam, is focused through the carrier substrate onto the metallic temporary bonding layer and the temporary bonding layer is thus melted and evaporated or sublimated.

In an alternative embodiment, a plurality of beams can be introduced in parallel for the energy input into the temporary bonding layer.

In a preferred embodiment, the substrate stack on the substrate holder can be brought to a specific temperature, cooled or heated. In particular, a greater thermal gradient for the crack formation can thus be achieved. Furthermore, an advantage of temperature treatment, in particular cooling, is that the gaseous products of the debonding radiation can condense and/or re-sublimate more quickly.

The energy input for the phase transition of the metallic temporary bonding layer is preferably introduced in a pulsed manner into the temporary bonding layer. The undesired overall heating of the substrate stack is thus reduced.

The energy input takes place in particular through the carrier substrate, which is transparent at least predominantly for the debonding radiation, directly into the temporary bonding layer. Any doped product substrates and/or any product substrates metallised in a non-transparent manner for the debonding beam can thus be separated.

According to the invention, it is particularly advantageous in particular for the reflected radiation to be measured in particular continuously during the energy input of the debonding radiation into the temporary bonding layer. The radiant power of the debonding device can thus be regulated in particular in real time. Furthermore, the reflected radiation quantity provides information as to the local separation that has taken place. The proportion of the reflected share of the radiation changes during the debonding process.

In a third process step, the locally heated metal vapour in particular in the deeper surrounding cavities of the carrier substrate is re-sublimated or condensed and solidified.

In an alternative embodiment, the locally heated metal vapour in the deeper surrounding cavities of the carrier substrate can first condense and then solidify.

In other words, in the third process step the temporary bonding layer is removed locally by means of pulsed laser radiation.

The carrier substrate is configured in such a way that the metal vapours are conveyed in particular in a flow-optimised manner into the cavities and the re-sublimation or the condensation and the solidification is thus a controlled process and not a physical effect left to its own devices.

This can be influenced in particular with the following actively adjustable parameters:

with the layout of the carrier substrate (percentage bearing area, shape and position of the cavities, pressure in the cavities of the substrate stack) and/or with the energy input of the debonding radiation (time, wavelength, energy density, area of the laser spot as parameters and/or with the overall temperature of the substrate stack and/or with the temperature gradient between the spot heated by means of debonding radiation on the elevation on the carrier substrate and the bottom of the cavities).

For a targeted influencing of the debonding process, is in particular conceivable according to the invention for the one side of the substrate stack to be cooled and the other side of the substrate stack to be heated. In particular, the product substrate can be heated and at the same time the carrier substrate can be cooled in particular with dry ice rinsing or liquid nitrogen rinsing, in order to locally influence the targeted condensation and/or re-sublimation.

The removed metallisation is embedded in particular in the cavities of the carrier substrate.

The protective layer applied on the product substrate can in particular absorb a part of the re-sublimated or condensed and solidified metallisation.

In a fourth process step, the carrier substrate and the product substrate are duly separated from one another.

In a fifth optional process step, the carrier substrate can be measured to establish whether the deposited metallisation should be removed or not. The carrier substrate is then available for temporary bonding for further product substrates.

The method can take place in an automated manner in a device. For this purpose, the process steps can be stored and carried out as recipes.

Recipes are optimised value collections of parameters which are associated functionally or in terms of the process. The use of recipes makes it possible to ensure reproducibility of production sequences.

Device for the Temporary Metal Bonding

The device used in the temporary bonding according to the invention is a bonder for metallic temporary bonds.

The function-relevant parts of the temporary bonder can in particular contain the following modules in a modular design:

bonding module,
alignment module,
cleaning module,
activation module,
metallisation module,
coating module,
movement apparatus, and/or
supply module for in particular compressed air, vacuum.

The temporary bonding method according to the invention is carried out in the bonding module. For this purpose, the substrates are preferably held fixed on substrate holders and thermally bonded. A function integration of a thermal bonding chuck with a substrate holder can thus take place.

According to the invention, it is in particular conceivable that a permanent bonding device performs the temporary bonding according to the invention.

For temporary bonds, similar to a hybrid bond, the alignment module can create a pre-bond and the bonding module, like a temperature-controlled oven, can metallically bond a plurality of substrate stacks simultaneously together in particular in a batch process.

The alignment precision between the product substrate and the carrier substrate can take place with mechanical alignment or in particular with optical alignment of the substrate edge. In some cases, an alignment with the aid of alignment marks on the substrates and/or substrate holders is also possible.

The alignment precision between the product substrate and the carrier substrate amounts to less than +/−150 micrometres, preferably less than +/−100 micrometres, particularly preferably less than +/−50 micrometres, very particularly preferably less than +/−25 micrometres, in the optimum case less than +/−10 micrometres, in the ideal case less than +/−1 micrometre, related to the centre points of the substrates and/or the periphery and/or alignment markings that are present.

According to the invention, it is particularly advantageous that bonding devices, which can produce permanent metal bonds between substrates, can also be used for metallic permanent bonds.

In a temporary bonder for metallic temporary bonds, the elevations of the carrier substrate in particular are metallically bonded and thus connected with the corresponding areas of the product substrate. In other words, a substrate stack is produced in the temporary bonder which, with the metallic temporary bonding layer, connects the elevations of the carrier substrate to the product substrate for the further processing of the product substrate.

The bonding force that is required for the bonding of the product substrate to the carrier substrate is dependent on which substrate size, and/or which metallisation and/or which metallised bonding surface are technologically required.

Bonding forces between 10 N and 100 kN, preferably between 10 kN and 90 kN, particularly preferably between 30 kN and 80 kN can be used. The bonding force can be used in particular for a good osculation of the substrates with one another. A higher bonding force has proved to be advantageous for metal bonds, wherein educts of the metallisation can develop a thin natural oxide layer, which can be broken up with the bonding force.

Device for Debonding of Metallic Temporary Bonds

The device used for the debonding according to the invention is a debonder for metallic temporary bonds.

The debonder for metallic temporary bonds can in particular be constituted in a modular design. If the debonder is constituted as an individual device without modules, the module designations are regarded as features for the individual functional groups and/or components.

In particular, at least the following modules can be present in the debonder:

debonding module,
further modules.

The further modules can include the following modules:

cleaning module in particular for removing the protective layer,
cleaning module for removing the excess metallisation from the carrier substrate,
module for a carrier flip-flop, in particular a tape or lamination module for fixing the in particular thin product substrate,
measuring module for the metallisation, and/or
separate laser module for the debonding module.

According to the invention, it is in particular advantageously possible for a separate laser module to generate the debonding radiation and only the "cold" radiation is coupled into the debonding module. The parasitic heat sources in the device can thus be reduced. The laser module—with suitable encapsulation of the optical components of the laser module—can be moved out into the grey room of a clean room, wherein suitable cooling for the radiation source can be ensured. The precisely air-conditioned clean room is not therefore heated and the waste heat can thus be carried away better out of the device.

The radiation source of the debonding module generates the debonding radiation, in particular a laser radiation. Alternatively, however, electron beams can be used as debonding radiation.

The use of different electromagnetic sources for generating a debonding beam for electromagnetic radiation is disclosed, which can be used for the detachment according to the invention:

microwave source,
infrared source, in particular an infrared source emitting mid-infrared (MIR),
a source emitting visible light,
UV source, and/or
X-ray source.

In particular, a source is conceivable which is suitable for bringing about the separation of the carrier substrate according to the invention, in particular by dissolution, most preferably by sublimation, of the metallic connecting layer, from the product substrate by electromagnetic waves.

A further aspect according to the invention also involves—the fact that metals have a very high absorption capacity for infrared radiation. Accordingly, the metallic temporary bonding layer is very well suited for being destroyed by an infrared laser.

The electromagnetic radiation of such a source can be incoherent or coherent. Sources which emit coherent electromagnetic radiation (lasers) are preferred. A microwave source, which emits coherent microwave beams, is referred to as a maser.

In the following text of the patent specification, coherence describes spatial and/or temporal coherence.

The wavelength of the debonding radiation lies between 10 nm and 10 mm, preferably between 150 nm and 200 micrometres, particularly preferably between 400 nm and 30 micrometres, very particularly preferably between 1 micrometre and 10 micrometres.

According to the invention, it is particularly advantageous if the maximum absorbance of the metallic temporary bonding layer and the wavelength of the radiation source for the debonding radiation are coordinated with one another, so that the debonding can take place effectively. It is also advantageous according to the invention if the maximum absorbance of the metallic temporary bonding layer and the maximum transmittance of the carrier substrate and the wavelength of the debonding radiation are coordinated with one another. For this purpose, the person skilled in the art can use the known Lambert-Beer relation.

Provision is made according to the invention such that the debonding radiation with a continuously operating radiation source can be interrupted with an electromechanical chopper and/or with a mirror system and/or conveyed into a sink, if the debonding radiation is not used, but the radiation source continues to be switched on.

In the case of a switchable radiation source such as an LED laser, the pulse duration of the debonding radiation can be electronically controlled and/or regulated.

The debonding radiation is directed in the debonding device onto the metallically connected regions of the substrate stack.

An important physical parameter of the used electromagnetic radiation is the intensity. The intensity is indicated in Watts. The intensity of the electromagnetic radiation is in particular greater than 0.1 Watts, preferably greater than 1 Watt, still more preferably greater than 100 Watts, most preferably greater than 1000 Watts, with utmost preference greater than 10 Kilowatts.

In the debonding device, the intensity profiles, i.e. the course of the intensity along a direction through the beam form of the debonding radiation, can be arbitrarily adjusted by means of optical elements. Preferred intensity profiles are:

Gaussian profile,
  rectangular profile,
  triangular profile, and/or
  elliptical profiles, in particular circular profiles.

The power of the laser, measured as luminous power, in particular radiant power, which can be delivered continuously to the substrate stack, in particular in the temporary bonding layer, amounts in particular to at least 5 W, preferably more than 10 W, still more preferably more than 15 W, most preferably more than 17 W, with utmost preference more than 30 W.

The preferred wavelength range of the laser lies between 100 nm-10,000 nm, preferably between 250 nm-1100 nm, still more preferably between 270 nm-430 nm, most preferably between 280 nm-380 nm.

In other embodiments, the preferred wavelength range of the laser lies between 1000 nm-10,000 nm.

In a particularly preferred embodiment, the wavelength of the laser can be adjusted and/or filtered by means of frequency converters, in particular acousto-optic modulators, in particular Bragg cells.

In a further preferred embodiment of the device, the laser beam contains at least one wavelength out of the totality of 1064 nm, 420 nm, 380 nm, 343 nm, 318 nm, 308 nm, 280 nm.

In particular, the use of laser beams with at least two wavelengths is especially advantageous, in order to be able to bring about in particular photochemical and photothermal processes combined in the temporary bonding layer.

In a particularly preferred embodiment of the device, the beam source is a diode laser.

The total energy of the laser radiation per substrate is set in particular between 0.01 mJ and 5000 kJ, preferably between 0.1 mJ and 4000 kJ, particularly preferably between 100 mJ and 2000 kJ.

The laser beam can be operated in a continuous mode or pulsed.

The pulse frequency is set in particular between 0.1 Hz and 300 MHz, preferably between 100 Hz and 500 kHz, particularly preferably between 10 kHz and 400 kHz, very particularly preferably between 100 kHz and 300 kHz.

The number of the pulses per substrate stack amounts, depending on the required total energy, to preferably more than 1 million pulses, preferably more than 3 million pulses, particularly preferably more than 5 million pulses, very particularly preferably 6 million pulses.

The energy which strikes the substrate stack per radiation pulse is set between 0.1 nJ and 1 J, preferably between 1 nJ and 900 $\mu$J, particularly preferably between 10 nJ and 500 $\mu$J.

The irradiated area per pulse lies in particular between 1 $\mu$m2 and 100.000 $\mu$m2, preferably 10,000 $\mu$m2 and 50,000 $\mu$m2, particularly preferably 1000 $\mu$m2 and 40,000 $\mu$m2, very particularly preferably between 2500 $\mu$m2 and 26000 $\mu$m2.

Synonyms for the irradiated area are known to the person skilled in the art as the spot size, the laser spot size.

The irradiation of a larger area can take place either over the full area or by means of a scanning procedure. If the areas with the temporary bonding layer are approximately as large as the irradiation area, a straightforward, non-scanning, irradiation takes place. If the areas with the temporary bonding layer are larger than the irradiation area, scanning irradiation preferably takes place.

The shape of the irradiation area is in particular circular, in other preferred embodiments elliptical, in particularly preferred embodiments rectangular.

The debonding radiation can preferably be focused. The length within which the focal point can be changed is in particular greater than 0.1 mm, preferably greater than 1 mm, still more preferably greater than 5 mm, most preferably greater than 10 mm, with utmost preference is greater than 20 mm.

According to a further development of the invention, a pulse-mode operation of the source used for the electromagnetic debonding radiation is provided. A relatively high intensity and power density can lead to a heat transfer from the temporary bonding layer to the substrates. In order to prevent such a heat transfer as far as possible, pulsed electromagnetic beams are preferably used. The pulse duration is in particular less than 10 seconds, preferably less than 1 second, still more preferably less than 1 microsecond, most preferably less than 1 nanosecond, with utmost preference less than 1 picosecond.

The aim of the pulsed-mode operation of the debonding radiation is the rapid, local, punctiform heating of the temporary bonding layer, so that the metallic temporary bonding layer is preferably sublimated, less preferably first melted and then transfers into the vapour phase.

By guiding the debonding beam, the temperature profile, in particular the temperature gradient, can be influenced with which the re-sublimation or the condensation and solidification of the dissolved temporary bonding layer is locally fixed in a targeted manner.

Accordingly, the re-sublimation or condensation or solidification of the temporary bonding layer can also be fixed by guiding the debonding beam.

BRIEF DESCRIPTION OF THE DRAWINGS

Further advantages, features and details of the invention emerge from the following description of preferred examples of embodiment and with the aid of the drawings. In the latter.

DETAILED DESCRIPTION OF THE INVENTION

In the figures, identical components or components with the same function are denoted by the same reference numbers. All the sketches can be seen enlarged for purposes of representation, so that the figures do not have to show the proportions of the actual embodiments.

Figure 1:
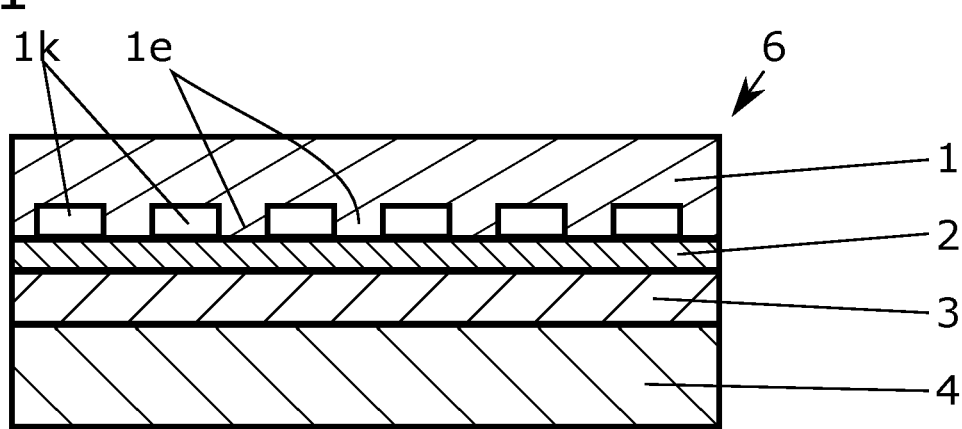
FIG. 1 shows a diagrammatic sketch of a substrate stack according to the invention in a first embodiment.

FIG. 1 shows a diagrammatic sketch of a substrate stack 6 according to the invention. Substrate stack 6 comprises a structured carrier substrate 1, an, in particular metallic, temporary bonding layer 2, a protective layer 3 and a product substrate 4.

In this embodiment, temporary bonding layer 2 is applied as a metallisation over the whole area on represented protective layer 3, which can be an atomic thin or molecular thin barrier layer.

Figure 2:
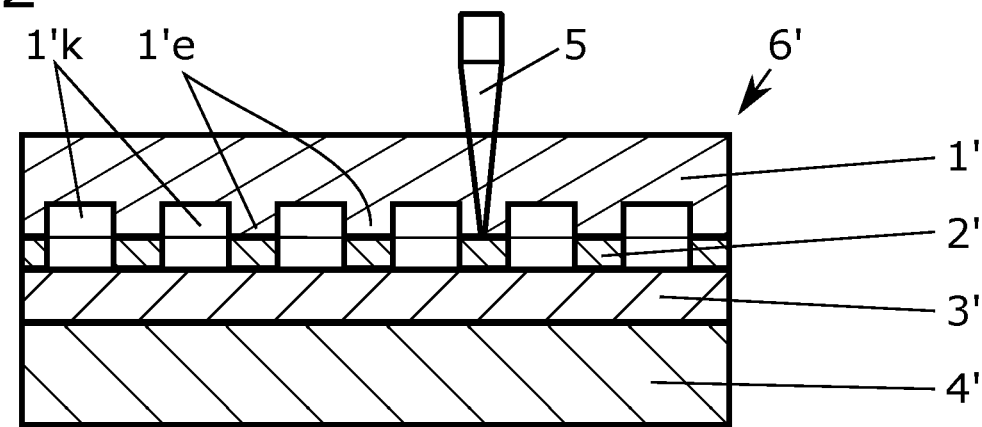
FIG. 2 shows a diagrammatic sketch of a substrate stack according to the invention in a second embodiment during debonding.

FIG. 2 represents a diagrammatic sketch of another substrate stack 6' according to the invention during debonding. In this embodiment of substrate stack 6', metallisation 2' has been applied only on elevations 1'e of carrier substrate 1', so that metallisation 2' represents only targeted partial areas of the temporary bonding layer. In other words, temporary bonding layer 2' has been applied in the form of islands. Protective layer 3' separates product substrate 4' from metallic temporary bonding layer 2'.

A debonding beam 5 strikes at a point on temporary bonding layer 2' applied on elevation 1'e through carrier substrate 1'.

The movement of temporary bonding layer 2' into surrounding cavities 1'k of carrier substrate 1' is not represented. The convergence of debonding beam 5 symbolises both the targeted deflection of bonding beam 5 as well as the focusing.

Figure 3A:
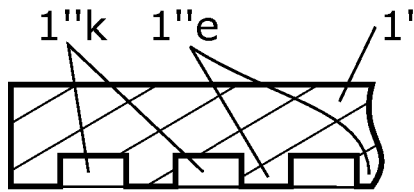
FIG. 3a-3c show diagrammatic sketches of carrier substrates in different embodiments.

FIG. 3a represents a further embodiment according to the invention of the in particular transparent carrier substrate 1". Carrier substrate 1" comprises a multiplicity of elevations 1"e, which can both support the product substrate (not represented) and also form the contact point for the temporary bonding layer (not represented).

Elevations 1"e can be distributed, in particular uniformly, on the carrier substrate linearly or in a grid-shaped array, in order to be able to enable uniform force absorption of the processing forces. Cavities 1"k of carrier substrate 1" are located between elevations 1"e.

Deposits of the residues of the temporary bonding layer after the re-sublimation or the condensation and solidification are not represented.

Figure 3B:
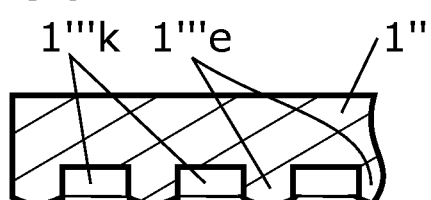

FIG. 3b represents another embodiment according to the invention of the in particular transparent carrier substrate 1'''. Carrier substrate 1''' comprises a multiplicity of elevations 1'''e, which can both support the product substrate (not represented) and also form the contact point for the temporary bonding layer (not represented). In this embodiment of carrier substrate 1''', elevations 1'''e have convex surfaces, so that point-like contacting in particular with the product substrate (not represented) is enabled. Compared to the embodiment in FIG. 3a, the effective areas of the temporary bonding layer (not represented) become smaller on account of the capillary effect of convex elevations 1'''e. On the one hand, a material saving can thus be achieved with the temporary bonding layer. On the other hand, effective debanding can be achieved due to the reduction in size of the support areas.

Figure 3C:
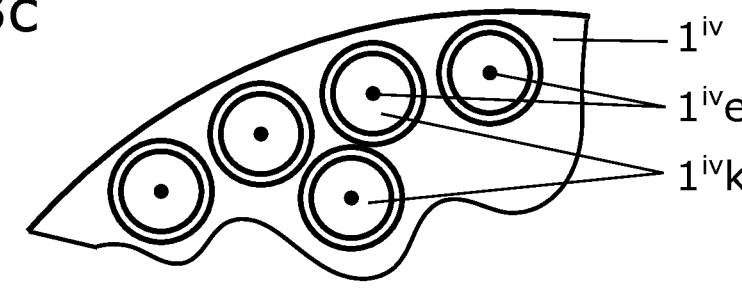

FIG. 3c represents a further embodiment according to the invention of the in particular transparent carrier substrate $1^{IV}$. Carrier substrate $1^{IV}$ comprises a multiplicity of elevations $1^{IV}e$, which can both support the product substrate (not represented) and also form the contact point for the temporary bonding layer (not represented). In this embodiment $1^{IV}$ of the carrier substrate, elevations $1^{IV}e$ are punctiform. They are surrounded by cavities $1^{IV}k$. The uniform distribution of elevations $1^{IV}e$ on carrier substrate $1^{IV}$ is particularly advantageous in this embodiment, wherein the percentage bearing area compared to the other embodiments 3a and 3b can turn out to be smaller.

LIST OF REFERENCE NUMBERS 1, 1', 1", 1''', $1^{IV}$ carrier substrate
1"e, 1'''e, $1^{IV}e$ elevations
1"k, 1'''k, $1^{IV}k$ cavities
2, 2' temporary bonding layer
3, 3' protective layer
4, 4' product substrate
5 debonding radiation
6, 6' substrate stack

What is claimed is:

1. A method of temporarily bonding a product substrate with a carrier substrate, comprising at least the following steps:

producing a metallized temporary bonding layer on the product substrate and/or on the carrier substrate, thermally bonding the product substrate with the carrier substrate at the metallized temporary bonding layer, wherein structures are formed in the carrier substrate, wherein the carrier substrate comprises elevations and cavities, wherein the elevations are stably connected to the product substrate via metallic contacts, and wherein the cavities are arranged between the elevations.

2. The method according to claim 1, wherein the metallized temporary bonding layer is produced on a protective layer on the product substrate.

3. The method according to claim 1, wherein the temporary bonding layer is produced at elevations of the carrier substrate.

4. The method according to claim 1, wherein a protective layer is applied on the product substrate before the production of the metallized temporary bonding layer on the product substrate and/or on the carrier substrate.

5. A substrate stack produced using the method according to claim 1, comprising:

the product substrate; and the carrier substrate, wherein the product substrate and the carrier substrate are connected by the metallized temporary bonding layer.

6. A device for temporarily bonding a product substrate with a carrier substrate, the device comprising:

producing means for producing a metallized temporary bonding layer on the product substrate and/or on the carrier substrate; and bonding means for thermally bonding the product substrate with the carrier substrate at the metallized temporary bonding layer, wherein structures are formed in the carrier substrate, wherein the carrier substrate comprises elevations and cavities, wherein the elevations are stably connected to the product substrate via metallic contacts, and wherein the cavities are arranged between the elevations.

7. A method for debonding a product substrate from a carrier substrate when the product substrate and the carrier substrate are temporarily bonded according to the method of claim 1 as a substrate stack by the metallized temporary bonding layer, the method for debonding comprising at least the following steps:

mounting and fixing the substrate stack on a substrate holder, focusing debonding radiation through the carrier substrate onto the metallized temporary bonding layer, thereby melting, evaporating and/or sublimating the metallized temporary bonding layer, and detaching of the product substrate from the carrier substrate.

8. The method according to claim 7, wherein a thermal conductivity of the carrier substrate lies between 0.1 W/(m*K) and 5000 W/(m*K).

9. The method according claim 7, wherein the substrate stack is heated and/or cooled by heating and/or cooling.

10. The method according to claim 7, wherein the debonding radiation is focused in a pulsed manner on the metallized temporary bonding layer.

11. The method according to claim 7, wherein an energy input of the debonding radiation into the metallized temporary bonding layer is measured, and a radiant power of the debonding radiation is controlled.

12. The method according to claim 7, wherein the melted and evaporated and/or sublimated metallized temporary bonding layer condenses and solidifies and/or re-sublimates in cavities of the carrier substrate before the detaching of the product substrate from the carrier substrate.

13. A device for debonding a product substrate from a carrier substrate, comprising:

a device according to claim 1 for temporarily bonding the product substrate with the carrier substrate as a substrate stack by the metallized temporary bonding layer, the device for the temporary bonding;

a substrate holder for mounting and fixing the substrate stack, a radiation source for focusing debonding radiation through the carrier substrate onto the metallized temporary bonding layer, thereby melting, evaporating and/or sublimating the metallized temporary bonding layer, and detachment means for detaching the product substrate from the carrier substrate.

14. The method according to claim 7, wherein the debonding radiation comprises a laser beam.

15. The device according to claim 13, wherein the debonding radiation comprises a laser beam.

16. The method according to claim 8, wherein the thermal conductivity of the carrier substrate lies between 1 W/(m*K) and 2500 W/(m*K).

17. The method according to claim 8, wherein the thermal conductivity of the carrier substrates lies between 0.5 W/(m*K) and 1000 W/(m*K).

\* \* \* \* \*